(12) United States Patent
Sakanoue et al.

(10) Patent No.: US 8,529,308 B2
(45) Date of Patent: Sep. 10, 2013

(54) ORGANIC ELECTROLUMINESCENCE ELEMENT WITH ENHANCED ELECTRON BLOCKING CHARACTERISTICS AND MANUFACTURING METHOD THEREOF

(75) Inventors: Kei Sakanoue, Fukuoka (JP); Takahiro Komatsu, Fukuoka (JP); Takayuki Takeuchi, Osaka (JP); Kenji Harada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/362,602

(22) Filed: Jan. 31, 2012

(65) Prior Publication Data

US 2012/0178191 A1    Jul. 12, 2012

Related U.S. Application Data

(62) Division of application No. 12/465,038, filed on May 13, 2009, now abandoned.

(30) Foreign Application Priority Data

May 13, 2008 (JP) ................. P2008-126112

(51) Int. Cl.
*H01J 9/00* (2006.01)
*H01L 51/50* (2006.01)
*H01L 51/54* (2006.01)
*H05B 33/00* (2006.01)

(52) U.S. Cl.
USPC ............. 445/24; 313/504; 313/506; 428/690; 257/98

(58) Field of Classification Search
None
See application file for complete search history.

(56) References Cited

U.S. PATENT DOCUMENTS

| 6,249,085 B1 | 6/2001 | Arai |
| 6,373,186 B1 | 4/2002 | Arai et al. |
| 6,774,561 B2 | 8/2004 | Hirano |

(Continued)

FOREIGN PATENT DOCUMENTS

| JP | 2000-215985 | 8/2000 |
| JP | 2002-216976 | 8/2002 |

(Continued)

OTHER PUBLICATIONS

Japan Office action, dated Apr. 21, 2011 along with a partial English-language translation thereof.

(Continued)

*Primary Examiner* — Sikha Roy
(74) *Attorney, Agent, or Firm* — Greenblum & Bernstein, P.L.C.

(57) ABSTRACT

To improve the light emission characteristics of a device when a transition metal oxide is used for the hole injection layer, in particular, to enhance the electron blocking characteristics of a transition metal oxide. An organic electroluminescence element comprising an anode, a cathode and a plurality of functional layers formed between the anode and the cathode, the functional layer containing a layer with a light-emitting function composed of at least one kind of an organic semiconductor and, between the anode and the layer with a light-emitting function, a charge injection layer composed of at least one kind of a transition metal oxide, wherein the ratio of the metal to oxygen at the anode side of the transition metal oxide layer is smaller than the stoichiometric ratio and at the same time, the ratio of the metal to oxygen at the layer with a light-emitting function side is greater than that at the anode side.

10 Claims, 8 Drawing Sheets

(56) References Cited

U.S. PATENT DOCUMENTS

| | | | |
|---|---|---|---|
| 7,145,824 | B2 | 12/2006 | Bill et al. |
| 7,785,718 | B2 | 8/2010 | Yatsunami et al. |
| 7,990,049 | B2 | 8/2011 | Shioya |
| 2003/0132434 | A1 | 7/2003 | Hirano |
| 2005/0170208 | A1 | 8/2005 | Yatsunami et al. |
| 2007/0063639 | A1 | 3/2007 | Hamano et al. |
| 2007/0108894 | A1 | 5/2007 | Hosokawa et al. |
| 2007/0131926 | A1* | 6/2007 | Lee et al. ............ 257/40 |
| 2007/0241665 | A1 | 10/2007 | Sakanoue et al. |
| 2007/0290604 | A1 | 12/2007 | Sakanoue et al. |
| 2009/0160325 | A1 | 6/2009 | Yatsunami et al. |
| 2009/0230391 | A1* | 9/2009 | Noshiro ............ 257/43 |

FOREIGN PATENT DOCUMENTS

| | | |
|---|---|---|
| JP | 2004-171951 | 6/2004 |
| JP | 2005-203340 A | 7/2005 |
| JP | 2007-287586 | 11/2007 |
| JP | 2007-288074 | 11/2007 |
| JP | 2008-16868 | 1/2008 |

OTHER PUBLICATIONS

H.C. Im et al., "Highly Efficient Organic Light-Emitting Diodes Fabricated Utilizing Nickel-Oxide Buffer Layers between the Anodes and the Hole Transport Layers", Thin Solid Films, vol. 515., 2007, pp. 5099-5102.

Jingze Li et al., "Enhanced Performance of Organic Light Emitting Device by Insertion of Conducting/Insulating WO3 Anodic Buffer Layer", Synthetic Metals, vol. 151., May 23, 2005, pp. 141-146.

Gitti L. Frey et al., "Novel Electrodes from Solution-Processed Layer-Structure Materials", Advanced Materials, vol. 14, No, 4., Feb. 19, 2002, pp. 265-268.

K.J. Reynolds et al., "Inorganic Solution-Processed Hole-Injecting and Electron-Blocking Layers in Polymer Light-Emitting Diodes", Journal of Applied Physics, vol. 92, No. 12., Dec. 15, 2002, pp. 7556-7563.

Japan Office action, mail date is May 24, 2011, that issued with respect to patent family member Japanese Patent Application No. 2008-126112.

* cited by examiner

ORGANIC ELECTROLUMINESCENCE ELEMENT WITH ENHANCED ELECTRON BLOCKING CHARACTERISTICS AND MANUFACTURING METHOD THEREOF

RELATED APPLICATIONS

The present application is a divisional of U.S. patent application Ser. No. 12/465,038, filed May 13, 2009, which is expressly incorporated herein by reference in its entirety. Additionally, the present application claims priority to Japanese Application No. P2008-126112, filed May 13, 2008.

BACKGROUND

The present invention relates to an organic electroluminescence element and a manufacturing method thereof. More specifically, the present invention relates to an organic electroluminescence element which is used, for example, in a display or display element for cellular phones or in various light sources and which is an electroluminescence element driven over a wide brightness range from low brightness to high brightness in usage for a light source or the like.

The organic electroluminescence element is a light-emitting device utilizing an electroluminescence phenomenon of a solid fluorescent substance and is partially put into practical use as a small display.

The organic electroluminescence element can be classified into several groups by the material used for the light-emitting layer. One representative example is a low-molecular organic electroluminescence element using an organic compound with a low molecular weight for the light-emitting layer, which is manufactured mainly using vacuum vapor deposition. Another example is a polymer organic electroluminescence element using a polymer compound for the light-emitting layer.

In the case of a polymer organic electroluminescence element, use of a solution prepared by dissolving materials constituting each functional layer enables film formation by a wet coating method such as spin coating, inkjet coating, nozzle coating, cap coating, spraying and printing. Thanks to this simple process, the wet coating method is attracting attention as a technique that can be expected to realize cost reduction and large screen area.

A typical polymer organic electroluminescence element is fabricated by stacking a plurality of functional layers such as charge injection layer and light-emitting layer. The construction and fabrication procedure of a representative polymer organic electroluminescence element are described below.

For example, as shown in FIG. 8, on a glass substrate 100 where an ITO (indium tin oxide) film is formed as the anode 1122, a PEDOT:PSS (a mixture of polythiophene and polystyrenesulfonic acid; hereinafter referred to as PEDT) thin film is formed as the electron (hole) injection layer 1123 by a spin coating method or the like. PEDT is a material that is a de-facto standard as the charge injection layer; and functions as the hole injection layer when disposed on the anode side.

On the PEDT layer, an interlayer 1124 composed of an organic polymer material is provided. The interlayer is, for example, a copolymer of a triphenylamine derivative and polyfluorene. For example, poly-(2,7(9,9-di-n-octylfluorene)-(1,4-phenylene-((4-sec-butylphenyl)imino)-1,4-phenylene)) indicated by TFB is used. This compound is excellent in the hole injection property and at the same time, has an electron blocking function. Therefore use of the compound brings about elevation of the light emission efficiency and improvement of the driving lifetime. Next, polyphenylene vinylene (hereinafter, indicated by PPV) and a derivative thereof, or polyfluorene and a derivative thereof, is film-formed as the light-emitting layer 1125 by a spin coating method or the like. On the light-emitting layer, injection of an organic material into the lowest unoccupied molecular orbital (LUMO) is efficiently performed using an electron injecting material 1126 of a material with a small work function such as an alkali metal or alkaline earth metal (e.g., Ba, Ca, Mg, Li, Cs) or a fluoride, oxide or carbonate of the metal above, e.g., LiF, BaO, $CsCO_3$. Thereafter, a metal electrode 1127 such as Al or Ag is provided as the cathode. The film of these metals is formed by a vacuum vapor deposition method, a sputtering method or a wet coating method:

In this way, the polymer organic electroluminescence element can be fabricated by a simple and easy process and because of this excellent property, its application to various uses is expected. However, PEDT:PSS used as the hole injection layer is an acidic water-soluble chemical compound, and this incurs the following problems: first, a problem in view of apparatus, that is, the compound corrodes metal portions of the coating apparatus used; secondly, a problem ascribable to bad wettability to a partition wall formed mainly of a resist material and provided to divide a picture element; and thirdly, a serious problem that because the compound has bad wettability to a material which has a light-emitting function and is dissolved in an organic solvent, when the picture element is divided into fine pixels of a display or the like, the uniformity of the coated film within a pixel becomes insufficient to impair the light emission uniformity or allow easy occurrence of short circuiting. Also, it is known that chemical deterioration is caused by the injection of an electric charge and adversely affects the lifetime.

Reduction of the light emission intensity, that is, deterioration, of the polymer organic electroluminescence element proceeds in proportion to the product of the electric energization time and the current flowing in the element, but its details are not yet elucidated and intensive studies thereon are being made.

Reduction of the light emission intensity is presumed to be brought about by various causes, but the cause is considered to be a combination of various factors such as stability of the light-emitting material itself or a functional layer (e.g., hole injection layer, electron injection layer) against an electron or a hole, side reaction from an exciton, thermal stability, stability of interface between layers, diffusion of a material due to heat, and oxidation of a cathode material.

In the polymer electroluminescence element, as described above, deterioration of PEDT is considered to be one of main causes of the reduction of the light emission intensity. As previously indicated, PEDT is a mixture of two polymer substances, that is, polystyrenesulfonic acid and polythiophene. The former is ionic and the latter has local polarity in the polymer chain. These two polymer substances are loosely bound through a Coulomb interaction ascribable to the electric charge anisotropy, and excellent charge injection characteristics are thereby exerted.

In order for PEDT to exert excellent characteristics, an intimate interaction between those two substances is indispensable, but in general, a mixture of polymer substances is likely to cause phase separation due to a subtle difference of solubility in a solvent. This is no exception to PEDT. Occurrence of phase separation indicates relatively easy breaking of the loose binding between two polymers. The phase separation suggests that when driven in an organic electroluminescence element PEDT may be unstable. Also, as a result of phase separation, a component not contributing to the binding, in particular, an ionic component, may diffuse due to an electric field associated with electric energization and adversely affect other functional layers. In this way, despite excellent charge injection characteristics, PEDT is not a stable substance by any means.

Against the above-described concern about PEDT, the present inventors have made various experiments and, based on the experiment results, proposed to form a transition metal oxide such as molybdenum oxide $MoO_3$ between an anode and a light-emitting layer instead of PEDT, and good injection characteristics can be thereby obtained (see, JP-2005-203340).

The problem relevant to the hole injection layer is greatly improved by the above invention, but from the standpoint of light emission efficiency, more improvements are being demanded, because the light emission efficiency sometimes decreases depending on the material used.

There have been also proposed a light-emitting diode having a laminated film of $MoS_2$ and $MoO_3$ formed by a coating method and a light-emitting element containing an electrode having a structure of $ITO/MoS_2/MoO_3$/polymer organic semiconductor layer with $MoS_2$ being annealed (see, Journal of Applied Physics, Vol. 92, 7556-7563 (2002) and Advanced Materials 2002, Vol. 14, 265-268). In both of these, $MoS_2$ is formed by a coating method and therefore, there is a problem that not only formation with a uniform thickness is difficult due to surface bulging in the pattern edge but also $MoS_2$ allows for a large leakage current to increase the leakage current with an adjacent pixel and is hard to integrally form particularly when achieving microfabrication and high integration.

Also, it is reported that when tungsten oxide is evaporated on ITO by an electron beam method and heat-treated at 450° C. to vapor-deposit a low molecular-type organic EL material, the light emission efficiency is enhanced (see, Synthetic metals, 151, 141-146 (2005)). But this technique cannot be used because the annealing temperature is as high as 450° C. and the high temperature adversely affects other constituent members such as insulating film or partition wall for the separation of a picture element in fabricating a display or the like. Furthermore, because the optimal film thickness is as very thin as 1.5 nm and the film thickness dependency is also large, there is a serious drawback of variation when a large-size substrate of second or greater generation is used.

A case of using nickel oxide is also known (see, Thin Solid Films, 515, 5099-5102 (2007)). This is a method of vapor-depositing a 10 nm-thick Ni metal and then heat-treating it at 500° C. to effect conversion into nickel oxide. The publication above indicates that emission efficiency is enhanced by performing a heat treatment and the optimal condition is 4 hours. However, also in the technique of this publication, the annealing temperature is high and, since metallic Ni is underlying, there is a problem that cross-talk occurs if the underlayer is entirely oxidized. In addition, it is not indicated that high efficiency can be achieved compared with the conventionally employed hole injection layer such as starburst amine or copper phthalocyanine.

In the case of using a large-size substrate, the large film thickness dependency greatly affects the yield and leads to incapability of stable mass production.

In this way, in the structure above, a hole injection layer composed of a transition metal oxide having a film thickness of approximately from 10 to 100 nm is used on an anode, and a functional layer such as light-emitting layer is formed thereon. The functional layer is mainly formed from an interlayer and a light-emitting layer or an electron transport layer and since the interlayer used here is a thin film having a thickness of around about 20 nm and contains almost the same organic solvent as the light-emitting material, intermixing between layers often occurs. Furthermore, the interlayer is required to have an electron blocking function so as to cause an electron injected from a cathode to stay in the light-emitting layer but cannot completely block an electron due to an intermixing problem between layers or a problem in view of chemical structure and a part of electrons are allowed to pass into an anode without being used for recombination, as a result, there arises a problem such as failure in obtaining sufficient emission efficiency.

Under these circumstances, the present invention has been made and an object of the present invention is to improve the light emission characteristics of a device when a transition metal oxide is used for the hole injection layer.

In particular, an object of the present invention is to enhance the electron blocking characteristics of a transition metal oxide.

SUMMARY

The present invention is an electroluminescence element comprising an anode; a cathode; a plurality of functional layers formed between the anode and the cathode, the functional layer including a layer with a light-emitting function formed from at least one kind of an organic semiconductor; a charge injection layer formed between the anode and the layer with a light-emitting function and formed of at least one kind of a transition metal oxide. A ratio of the transition metal to oxygen at the anode side in the transition metal oxide layer is smaller than a stoichiometric ratio and a ratio of the transition metal to oxygen at the layer with a light-emitting function side is greater than that at the anode side.

Usually, a transition metal oxide such as molybdenum oxide film-formed in a reducing atmosphere is oxygen-deficient based on the stoichiometric ratio and as compared with those where the ratio of the metal to oxygen is the stoichiometric ratio, the specific resistance is small enough to allow for hole transport. On the other hand, molybdenum oxide at the stoichiometric ratio is known to be an insulator. Accordingly, when a hole injection layer formed in this way is subjected to a surface oxidation treatment such as heat treatment, UV treatment or oxygen plasma treatment in the atmosphere, oxidation proceeds only in the surface to relatively increase the proportion of oxygen and bring about approximation to the theoretical ratio of the compound, and the insulating property is thereby enhanced, as a result, an electron blocking function is exerted. Also, in the case of forming a hole injection layer across a plurality of picture elements, when the specific resistance is small, cross-talk readily occurs to decrease the image contrast and therefore, although depending on the required specification of contrast, the original specific resistance at the film formation is preferably above a certain resistance. Furthermore, it is experimentally known that if oxidation further proceeds to establish the stoichiometric ratio in the entire layer, conversely, the injection efficiency is greatly impaired. For this reason, an oxygen-deficient region and a region having a value close to the stoichiometric ratio need to be present together. As described above, a layer having a composition nearly in the stoichiometric ratio is an insulator and therefore, in this case, the mechanism of bringing about injection of a hole is considered to utilize a tunnel current. Accordingly, this layer can be imparted with an electron blocking function, enabling omission of an electron blocking layer formed of an organic material, and thanks to more reduction in the film thickness, an organic electroluminescence element that is driven at a low voltage and has high emission efficiency can be provided.

The present invention includes the organic electroluminescence element according to aforementioned one that the transition metal oxide layer is a transition metal oxide layer formed by performing a surface oxidation treatment after film formation.

By virtue of this construction, a state where an oxygen-deficient region and a region having a value close to the stoichiometric ratio are present together can be easily obtained after film formation of the transition metal oxide layer. In the oxidation treatment, oxidation is considered to proceed in the thickness direction of a thin film according to the time, power, temperature and the like of the oxidation treatment, but if oxidation proceeds and the stoichiometric ratio is established in the entire layer, conversely, the injection efficiency is greatly impaired. Accordingly, in order to maximally bring out the effect of enhancing the light emission efficiency of the present invention, it is considered to be necessary that on the side in contact with the anode, oxygen deficiency is present to form a defect level on HOMO (Highest Occupied Molecular Orbital) and on the side in contact with a material having a light-emitting function, only the extreme surface is subjected to an oxidation treatment.

The present invention also includes the organic electroluminescence element according to aforementioned one that the transition metal oxide layer contains a transition metal oxide layer with the surface which surface is oxidized by a heat treatment.

According to this construction, the transition metal oxide layer can be formed in a short time by performing an oxidation treatment with good workability.

The present invention also includes the organic electroluminescence element according to aforementioned one that the transition metal oxide layer contains a transition metal oxide layer which surface is oxidized by an ultraviolet treatment.

According to this construction, the ultraviolet irradiation time is easy to control, so that the oxide depth can be controlled with high precision.

The present invention also includes the organic electroluminescence element according to aforementioned one that the transition metal oxide layer contains a transition metal oxide layer which surface is oxidized with an oxygen-containing plasma.

Accordingly to this construction, the oxide depth can be controlled with higher precision by controlling the plasma intensity, plasma density and accelerating time.

The present invention also includes the organic electroluminescence element according to aforementioned one that the transition metal oxide layer is formed by a dry process.

By virtue of this construction, a transition metal oxide that is stable and excellent in the film quality can be formed.

In organic electroluminescence element above of the present invention, out of the transition metal oxide layers, the transition metal oxide layer positioned on the anode side preferably has a specific resistance of $1 \times 10 \exp(5)$ Ωcm or more.

By virtue of this construction, cross-talk can be reduced even when the transition metal oxide layer is integrally formed across a plurality of picture elements. Incidentally, in the case where the hole injection layer is not formed across a plurality of picture elements but is independently formed for each picture element, the cross-talk does not substantially occur as a problem and therefore, in order to reduce the voltage drop ascribable to the transition metal oxide layer itself and enable high brightness emission, the transition metal oxide layer above preferably has a lower specific resistance of 10,000 Ωcm or less.

The present invention also includes the organic electroluminescence element according to aforementioned one that the transition metal oxide layer is integrally formed across a plurality of picture elements.

According to this construction, even when the transition oxide layer is integrally formed across a plurality of picture elements, the problem of cross-talk does not arise by virtue of the large specific resistance and the layer with a light-emitting function formed thereon, particularly the coating-type layer, can easily have a uniform film thickness without causing variation of the contact angle, because the underlying layer is entirely formed of the same material. In this case, a picture element regulating layer is preferably formed below the transition metal oxide layer.

In the organic electroluminescence element above of the present invention, the visible light transmittance of the metal oxide layer is preferably 70% or more.

By virtue of this construction, a sufficiently large quantity of emitted light can be maintained.

Also, the present invention is a method for manufacturing an electroluminescence element comprising an anode; a cathode; a plurality of functional layers formed between the anode and the cathode, the functional layer including a layer with a light-emitting function formed from at least one kind of an organic semiconductor; and a charge injection layer formed between the anode and the layer with a light-emitting function and formed of at least one kind of a transition metal oxide layer. The method comprises the step of forming the transition metal oxide layer is a step of forming the transition metal oxide layer such that the ratio of the metal to oxygen at the anode side in the transition metal oxide layer is smaller than the stoichiometric ratio and the ratio of the metal to oxygen at the layer with a light emitting function side is greater than that at the anode side As described above, according to the present invention, the transition metal oxide thin film formed to have oxygen deficiency is in an oxygen-deficient state and allows for injection of a hole, despite high specific resistance, but the light emission efficiency sometimes slightly decreases according to the light-emitting material used. The reason therefor is considered because the electron blocking ability is insufficient. In order to compensate for this reduction of light emission efficiency, it may be effective to shift the recombination region of a hole and an electron to the side closer to the cathode without locating it at the interface between the interlayer and the light-emitting layer, but the energy is sometimes transferred out to the cathode side depending on the diffusion distance of an exciton produced and a sufficiently high effect may not be obtained. In the present invention, after the formation of a transition metal oxide thin film having oxygen deficiency, only the extreme surface layer is oxidized by surface oxidation or the like to relatively increase the proportion of oxygen and bring about approximation to the theoretical ratio of the compound, and an electron blocking function is thereby exerted in the surface, so that an organic electro-luminescence element with high emission efficient can be manufactured.

EMBODIMENTS

Figure 1:
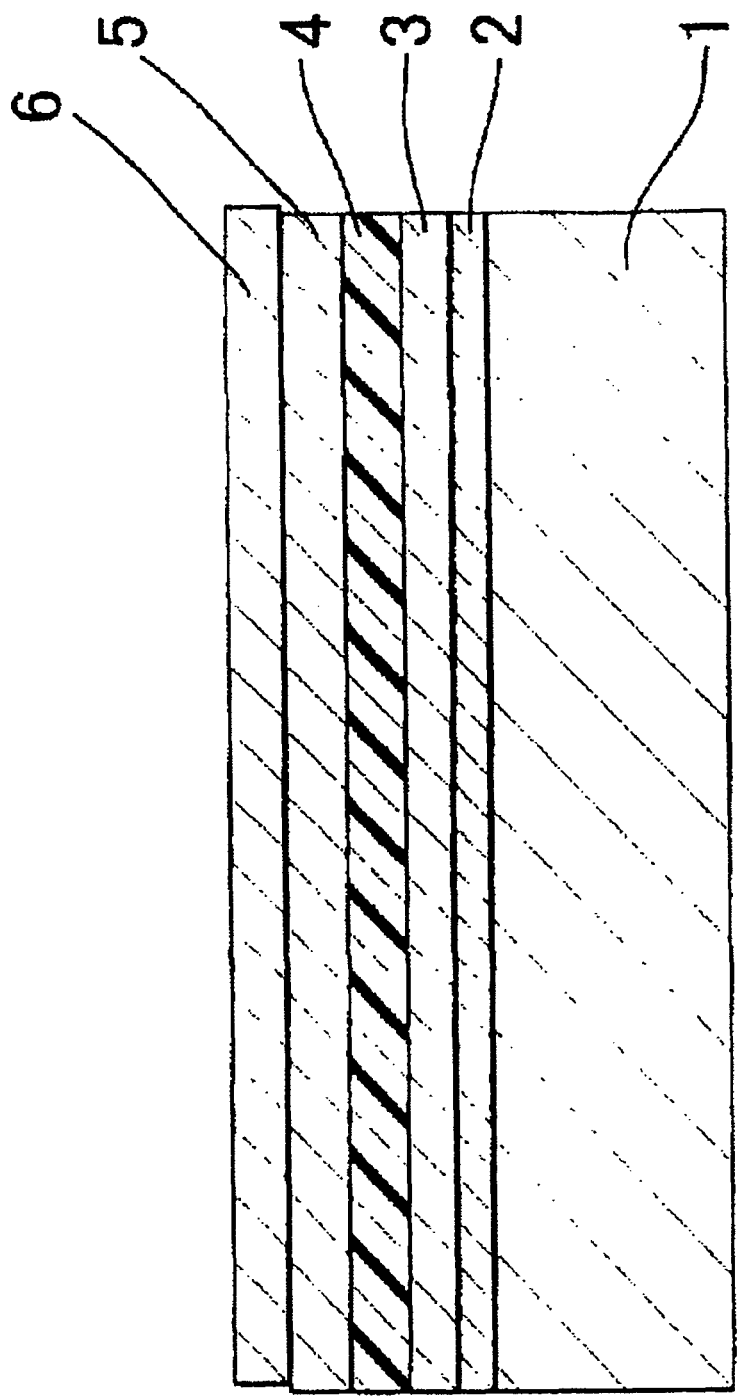
FIG. 1 A schematic explanatory view showing the structure of the organic electroluminescence element according to embodiment 1 of the present invention.

Embodiments of the present invention are described in detail below by referring to the drawings.

Embodiment 1

The fundamental structure of the polymer organic electroluminescence element according to embodiment 1 of the present invention illustrated in FIG. 1 is described.

As shown in FIG. 1 illustrating a schematic explanatory view of the structure, this embodiment is characterized in that by oxidizing the surface of a molybdenum oxide layer ($MoO_x$) as the transition metal oxide layer formed between an anode and a layer with a light-emitting function, the ratio of the molybdenum to oxygen on the anode side ($MoO_{x1}$) of the molybdenum oxide layer is made smaller in terms of the oxygen content than the stoichiometric ratio and the ratio of the molybdenum to oxygen at the layer with a light-emitting function side ($MoO_{x2}$) is made greater than that at the anode side. In the formulae, X2<3 and X1<X2. In other words, a bottom emission-type organic electroluminescence element is fabricated, where a surface oxidized molybdenum oxide thin film as the hole injection layer 3 and a polymer material as the light-emitting layer 4 are sequentially stacked on an anode 2 composed of an indium tin oxide (ITO) layer formed on a light-transmitting glass substrate 1, an electron injection layer 5 composed of an alkaline earth metal is further formed thereon, and a cathode 6 composed of an aluminum layer is sequentially stacked as an upper layer.

More specifically, the organic electroluminescence element of this embodiment comprises, as shown in FIG. 1, a substrate 1 composed of a light-transmitting glass material, an ITO thin film as the anode 2 formed on the substrate 1, and layers further formed thereon, that is, a transition metal oxide thin film as the charge injection layer 3, a light-emitting layer 4 composed of a polymer material, an electron injection layer 5 composed of a barium layer, and a cathode 6 composed of an aluminum layer.

When a DC voltage or a DC current is applied using the anode 2 of the organic electroluminescence element above as a plus electrode and the cathode 6 as a minus electrode, a hole is injected into the light-emitting layer 4 composed of a polymer film from the anode 2 through the hole injection layer 3 and at the same time, an electron is injected thereinto from the cathode 6. In the light-emitting layer 4, recombination of the thus-injected hole and electron takes place and when an exciton generated by the recombination undergoes a transition from an excited state to a ground state, a luminescence phenomenon occurs.

According to the organic electroluminescence element of this embodiment, the hole injection layer is composed of a surface-oxidized molybdenum oxide and therefore, stabilization and enhancement of injection characteristics can be achieved, which enables enhancing the light emission characteristics and prolonging the lifetime, so that a bottom emission-type organic electroluminescence element with high reliability can be fabricated.

In embodiment 1, it is more effective that not only the ratio of molybdenum to oxygen at the layer with a light-emitting function side ($MoO_{x2}$) is greater than that at the anode side but also the proportion of oxygen is greater than the stoichiometric ratio (X2>3).

Embodiment 2

Figure 2:
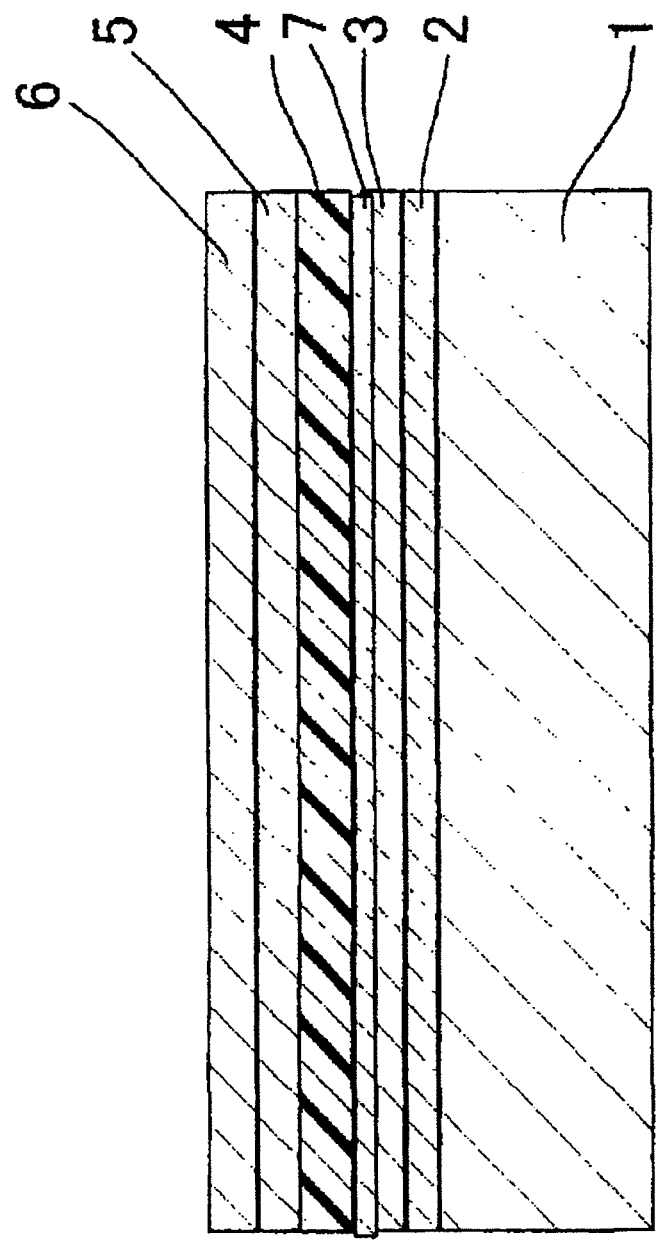
FIG. 2 A schematic explanatory view showing the structure of the organic electroluminescence element according to embodiment 2 of the present invention.
Figure 3:
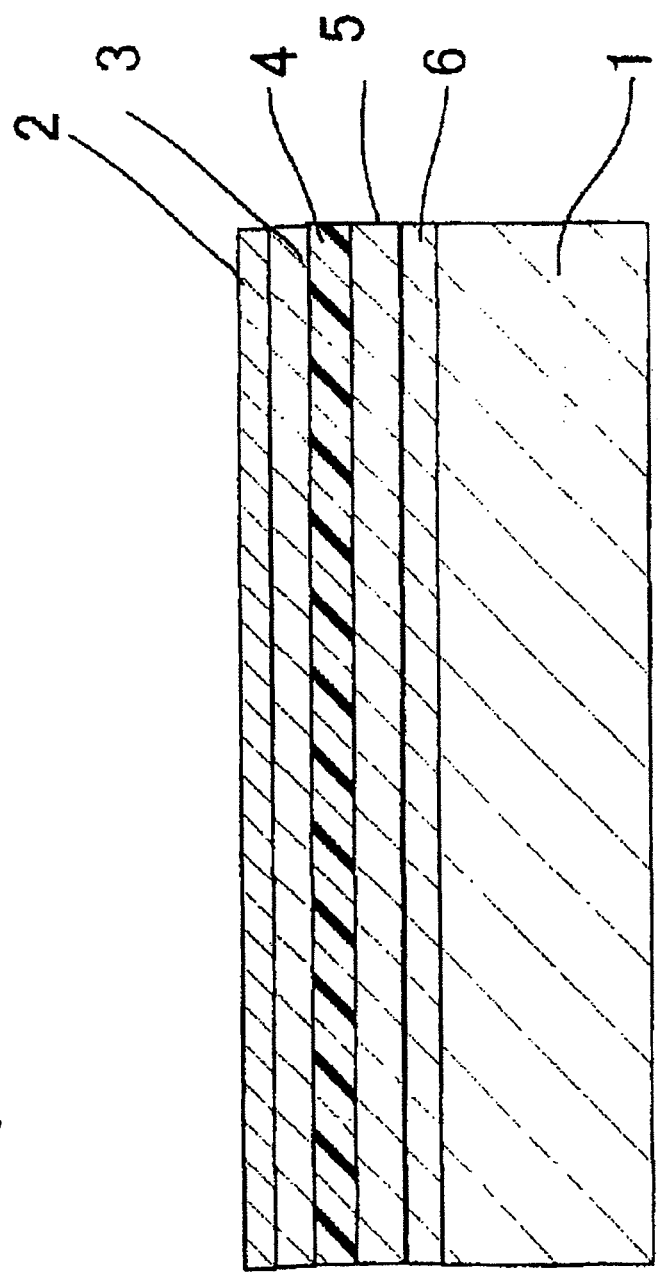
FIG. 3 A schematic explanatory view showing the structure of the organic electroluminescence element in Example 3 of the present invention.

The fundamental structure of the polymer organic electroluminescence element according to embodiment 2 of the present invention illustrated in FIG. 2 is described.

The difference of this embodiment from the organic electroluminescence element of embodiment 1 is that, as shown in FIG. 2, an interlayer (electron blocking layer) 7 having a film thickness of about 20 nm and being composed of TFB is caused to intervene between the light-emitting layer 4 and the molybdenum oxide 3 as the hole injection layer of the organic electroluminescence element of embodiment 1 shown in FIG. 1. This interlayer has a LUMO level at a position shallower than the light-emitting layer and can be designed such that substantially no electron transfer occurs by forming a barrier to electron injection from the light-emitting layer into the interlayer or making the electron mobility smaller than the hole mobility. Other parts are formed similarly to the organic electroluminescence element of embodiment 1.

More specifically, the organic electroluminescence element of this embodiment comprises, as shown in FIG. 2, a substrate 1 composed of a light-transmitting glass material, an indium tin oxide (ITO) thin film as the anode 2 formed on the substrate 1, and layers further formed thereon, that is, a surface-oxidized transition metal oxide thin film as the hole injection layer 3, an interlayer 7, a light-emitting layer 4 composed of a polymer material, an electron injection layer 5, and a cathode 6 composed of an aluminum layer.

Also in this case, when a DC voltage or a DC current is applied using the anode 2 of the organic electroluminescence element above as a plus electrode and the cathode 6 as a minus electrode, a hole is injected into the light-emitting layer 4 that is composed of a polymer film and formed by a coating method, from the anode 2 through the hole injection layer 3 and at the same time, an electron is injected thereinto from the cathode 6. Here, the interlayer 7 acts as the electron blocking layer. In the light-emitting layer 4, recombination of the thus-injected hole and electron takes place and when an exciton generated by the recombination undergoes a transition from an excited state to a ground state, a luminescence phenomenon occurs.

According to the organic electroluminescence element of this embodiment, in addition to the operation and effect of embodiment 1, owing to intervention of the interlayer 7, the electron blocking function is more enhanced and the probability of recombination of an electron and a hole can be raised, which enables enhancing the light emission characteristics and prolonging the lifetime, so that an organic electroluminescence element with high reliability can be fabricated.

In advance of description of the following Examples, respective components constituting the organic electroluminescence element of the present invention are described.

(Electron Injection Layer)

The electron injection layer of Examples can be composed of an alkali metal or alkaline earth metal having a small work function. Specific examples thereof include, but are not limited to, Ca, Ba, Li and Cs. Other than these metals, their oxides (e.g., CaO, BaO, Li$_2$O, Cs$_2$O$_3$, MgO) and halides (e.g., LiF) are included.

It is also preferred to use titanium oxide, zinc oxide or the like having a defect level. In the case of using such a material, even when the element is left standing in the atmosphere, the reaction with moisture or oxygen is decreased in comparison with the case of using an alkali metal and/or an oxide, halide or carbonate thereof and driving in the atmosphere, which is supposed to be a drawback of the organic EL, becomes possible.

In the case where such titanium oxide or zinc oxide is used as the electron injection layer and combined with the hole injection layer of the present invention, since the hole injection layer of the present invention has an electron blocking function, even when an interlayer is not used, an exciton produced undergoes recombination without allowing energy transfer to an electrode and therefore, the light emission region in the light-emitting layer can be shifted to the hole side. In turn, the layer construction becomes simple, which contributes to enhancement of the yield or reduction of the cost. In this case, the layer construction is anode/transition metal oxide layer/organic light-emitting layer/transition metal oxide layer/cathode and is a very simple construction. The transition metal oxide layer sandwiched between the cathode and the organic light-emitting layer preferably contains, as a dopant, an alkali metal or alkaline earth metal such as CaO, BaO, Li$_2$O, Cs$_2$O$_3$ and MgO. These are unstable in the atmosphere but when doped in molybdenum oxide or the like having a defect level, the instability is decreased and at the same time, the electron injection property can be improved. Moreover, since the periphery thereof is covered with a transition metal oxide matrix, diffusion into other layers less occurs and an adverse effect is hardly given on the light emission efficiency or driving lifetime. In general, release of an electron is expected to become difficult, but in the case of the present invention, as a result of various experiments, good electron releasability is exhibited with little occurrence of such a side effect. Accordingly, by the use of the element structure of the present invention, an electron transport layer composed of an organic material or a layer composed of an alkali metal or the like having a low work function, which has been conventionally required, need not be disposed and a robust element can be obtained.

As for the impurity-containing transition metal oxide layer used as the electron injection layer in the present invention, those having a work function of 4 to 6 eV are preferably used, but the present invention is not limited thereto.

Incidentally, zinc is recently sometimes classified into the representative element but is dealt with here as an element included in the transition metal element of the present invention.

(Hole Injection Layer)

For the hole injection layer used in the present invention, a transition metal oxide is preferably used.

When a transition metal oxide is used, an electrode material even containing an ionic substance acts as a barrier layer, and a reactive substance is not allowed to diffuse from the electrode side and incur deterioration of the light-emitting layer. Also, in the case of forming a thin film of a transition metal oxide such as molybdenum oxide, nickel oxide and vanadium oxide by a process of creating a defect level or producing a difference in the oxidation number, efficient charge injection of the organic electroluminescence element is attained. Furthermore, when the specific resistance is small, in use as a thin film of 1 μm or less, the voltage drop is reduced and an electric field applied between two electrodes is directly applied to the light-emitting layer, which enables driving at a low voltage. In addition, the transition metal oxide thin film of the present invention has multiple functions such as electron injection properly, electron transport property and electron blocking property and therefore, high functionality can be obtained by a single layer, making it possible to simplify the layer construction of the element and realize a low-cost device.

The thickness of the surface-oxidized transition metal oxide layer is preferably from 1 nm to 1 μm.

If the thickness exceeds 1 μm, high transmittance can be hardly ensured. Considering the film-forming time, the thickness is more preferably 500 nm or less. Also, in the case of a thin thickness, even when the layer is not in a film state but in an island state, as long as the average thickness is about 1 nm, the same effects as above can be obtained. If the thickness is less than 1 nm, sufficient hole injection characteristics cannot be obtained.

Specifically, other than molybdenum oxide, for example, tungsten oxide, nickel oxide, vanadium oxide and ruthenium oxide may be used, but the present invention is not limited thereto. Such a compound takes a plurality of oxidation states and becomes an insulator when the ratio of metal to oxygen is the stoichiometric ratio or exhibits electrical conductivity when having an oxygen deficiency, and an electron blocking agility can be imparted to the compound by controlling the oxidation state in the film thickness direction as in the present invention. The oxidation number or composition can be confirmed by XPS (X-ray photoelectron spectroscopy) analysis.

As for the surface oxidation method, oxidation after film formation is simple and easy. For example, various methods such as UV irradiation or heat treatment in an oxygen-present atmosphere, oxygen plasma irradiation, and oxidation treatment by solution may be applied, and the method is not limited. It is also possible to form a film while varying the conditions such that the ratio of metal to oxygen reaches a desired value during the film formation described later.

(Light-Emitting Layer Interlayer)

On the hole injection layer, a light-emitting layer is formed by coating an organic semiconductor material. At this time, in view of light emission efficiency, an interlayer is preferably provided as the hole blocking layer between the light-emitting layer and the hole injection layer. For the hole blocking layer, a polyfluorene-based polymer material having a LUMO level higher than the material used for the light-emitting layer or having low electron mobility, such as TFB having a triphenylamine skeleton, is used, but the present invention is not limited thereto. As regards the light-emitting layer, in the case of a polymer type, in addition to the polyfluorene-based and polyphenylene vinylene-based copolymers, as long as a thin film can be formed by dissolving the polymer in a solvent and coating the solution, the polymer is not limited in its kind, including a pendant type, a dendrimer type, and a type that is coated after doping a low-molecular light-emitting material into a coating-type low molecular or polymer host capable of dissolving in a solution and exhibiting good thin-film performance without causing crystallization or the like.

In the organic electroluminescence element of the present invention, the layer with a light-emitting function is not limited to a polymer compound, and any of a low molecular compound, an oligomer and the like may be used. As for these materials, conventionally known materials may be used.

A representative structure of the low molecular electroluminescence device includes a layer structure of substrate/anode/hole injection layer/hole transport layer/electron blocking layer/light-emitting layer (including a doping material)/hole blocking layer/electron transport layer/electron injection layer/cathode, but other than this, the layer structure has various variations. Like this, the structure is a multilayer structure compared with the polymer-type electroluminescence device, which is a factor of rising cost. By using the hole injection layer of the present invention, a hole injection layer, a hole transport layer and an electron blocking layer can be integrated, and this is effective in reducing the cost.

(Layer Construction)

In the example above, a so-called bottom emission type of extracting light from the substrate side is described, but the top emission type of extracting light from the direction opposite the substrate (in this case, a high-reflectance silver alloy or aluminum alloy is preferably used as the anode) includes a reverse structure type where the anode and the cathode are reversely disposed, a top emission type thereof, and the like and, in terms of the material, is applicable when using various compounds such as fluorescent material and phosphorescent material. In this case, by providing the hole injection layer of the present invention, generation of a so-called hillock that is readily produced when heating a reflective anode can be prevented.

(Cathode)

As for the cathode, a material capable of establishing ohmic contact with the electron injection layer of the present invention is preferred. A general metal typified by Al, Ag or Au, a transparent electrically conductive oxide typified by ITO and IZO, and the like are preferably used.

(Encapsulation)

The device of the present invention is preferably subjected to encapsulation. In the case of a conventional electroluminescence device, an enormous cost is required for ensuring the reliability, for example, use of an encapsulating resin having as small moisture permeability as possible, film encapsulation by a thin film layer formed on the element, or sealing of a desiccant is employed. According to the present invention, simple encapsulation of the device is necessary, but the cost can be reduced by a conventional encapsulation method. The simple encapsulating material can be widely selected from existing materials.

(Film Formation Method)

Out of the functional layers constituting the organic electroluminescence element of the present invention, the transition metal oxide layer configured such that the ratio of the transition metal to oxygen on the anode side is small in terms of the oxygen content than the stoichiometric ratio and at the same time, the ratio of the transition metal to oxygen at the layer with a light-emitting function side is greater than that at the anode side, is preferably formed by a dry process such as vacuum vapor deposition, electron beam vapor deposition, molecular beam epitaxy, sputtering, reactive sputtering, ion plating, laser ablation, thermal CVD, plasma CVD and MOCVD.

It is known from experimental results that in such a dry process, the substrate temperature is preferably controlled. Incidentally, in the case of a vapor deposition method, enhancement of brightness and reduction of light emission initiating voltage can be achieved by setting the substrate temperature to from 60 to 100° C. Also in the case of a sputtering method, despite a rise of the substrate temperature during sputtering, in view of introducing necessary oxygen defects, it is preferred to raise the substrate temperature from the starting point of sputtering.

The film may also be formed while changing the introduced amount of oxygen in the course of sputtering a metal target by using a reactive sputtering method. That is, a continuous formation method of film-forming a first layer having an oxygen defect and then film-forming a transition metal oxide layer while increasing the oxygen content is also effective.

Furthermore, a composition gradient film may also be formed by vapor co-deposition while changing the amount of evaporation from the target.

It is also effective to form a film by a co-sputtering method using as a target an alloy obtained by mixing transition metal oxides differing in the composition or using a plurality of targets containing a plurality of kinds of transition metals such as molybdenum and tungsten. Also in this case, a transition metal oxide film having a desired oxygen content can be obtained by performing the sputtering while changing the amount of oxygen or while switching the target between those differing in the oxygen content.

The film thickness is preferably in the range not impairing the hole injection property and is preferably from several nm to 500 nm. The film thickness is preferably thin because the transmittance loss increases when the film thickness becomes thick, but the film thickness may be determined by taking into consideration the variation and the like at the mass production.

A nanoparticle or the like of an oxide is also applicable. In this case, the film formation method may be appropriately selected also from wet processes such as sol-gel process, Langmuir-Blodgett method (LB method), layer-by-layer method, spin coating, inkjet coating, dip coating and spraying, and as long as the film can be formed to finally provide the effects of the present invention, any method may be used.

In the case of forming a functional layer (a light-emitting layer or a hole or electron injection layer that is formed, if desired) of the present invention from a polymer material, a spin coating method, a casting method, a dipping method, a bar coating method, or a wet process such as roll coating, inkjet coating, nozzle coating and spraying, is used. In this case, a large-scale vacuum apparatus is not necessary, enabling film formation using inexpensive equipment, and at the same time, a large-area organic electroluminescence element can be easily manufactured.

Incidentally, the glass substrate 100 is one sheet of a colorless transparent glass. Examples of the glass substrate 100 which can be used include a transition metal oxide glass such as transparent or semi-transparent soda lime glass, barium/strontium-containing glass, lead glass, aluminosilicate glass, borosilicate glass, barium borosilicate glass and quartz glass, and an inorganic glass such as inorganic fluoride glass.

Embodiment 3

The display device using the organic electroluminescence element in an embodiment of the present invention is described below. This embodiment is one example of the top emission-type polymer organic electroluminescence display device.

First, a display device using an organic electroluminescence element is described. The display device of this embodiment is fundamentally manufactured as follows: an insulating film is provided on a driving substrate comprising a glass substrate having produced and provided thereon a transistor composed of polysilicon; an aluminum alloy is patterned thereon as the anode; and a sputtering film of molybdenum oxide and tungsten is formed thereon as the hole injection layer to extend across a plurality of picture elements. By forming the hole injection layer in this way without separating between picture elements, the process can be simplified. Subsequently, the surface is oxidized by an annealing treatment in the atmosphere; a partition wall is provided to separate respective picture elements of RGB; an interlayer and a light-emitting layer are coated by an inkjet method; a Ba-doped low-molecular electron transport material is vapor co-deposited as the electron transport layer on the entire surface of RGB picture elements; ITO is then sputtered as the cathode; and the stack is subjected to encapsulation to manufacture a device. Thanks to the annealing treatment in the atmosphere performed here, the light emission efficiency is enhanced. In this embodiment, the surface is annealed to relatively increase the proportion of oxygen and bring about approximation to the theoretical ratio of the compound, whereby an electron blocking function is caused to be exerted in the surface. Furthermore, in this embodiment, a barium oxide-containing molybdenum oxide layer (electron injection layer) 5 is provided as a functional layer to intervene on the cathode 6 side, and an active matrix-type display device is fabricated using the same light-emitting device as the organic electroluminescence element of embodiment 1 shown in FIG. 1. It is considered that by virtue of such a construction, although the transition metal oxide is oxygen-deficient and has a small specific resistance, when molybdenum oxide (transition metal oxide) is oxidized by surface oxidation or the like, this allows increasing the proportion of oxygen on the light-emitting layer side and bringing about approximation to the theoretical ratio of the compound, as a result, an electron blocking function is exerted in the surface.

Figure 4:
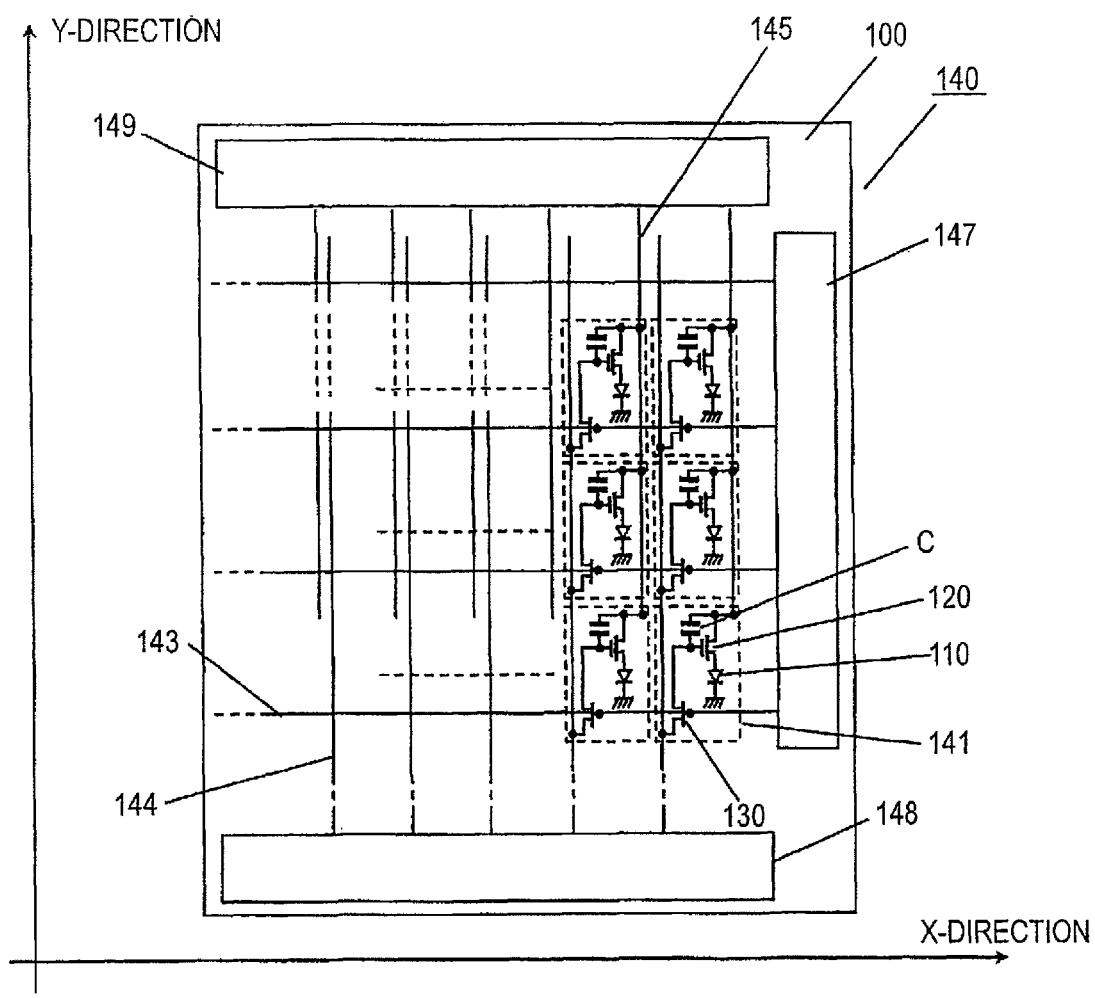
FIG. 4 An equivalent circuit diagram of the display device according to embodiment 3 of the present invention.
Figure 5:
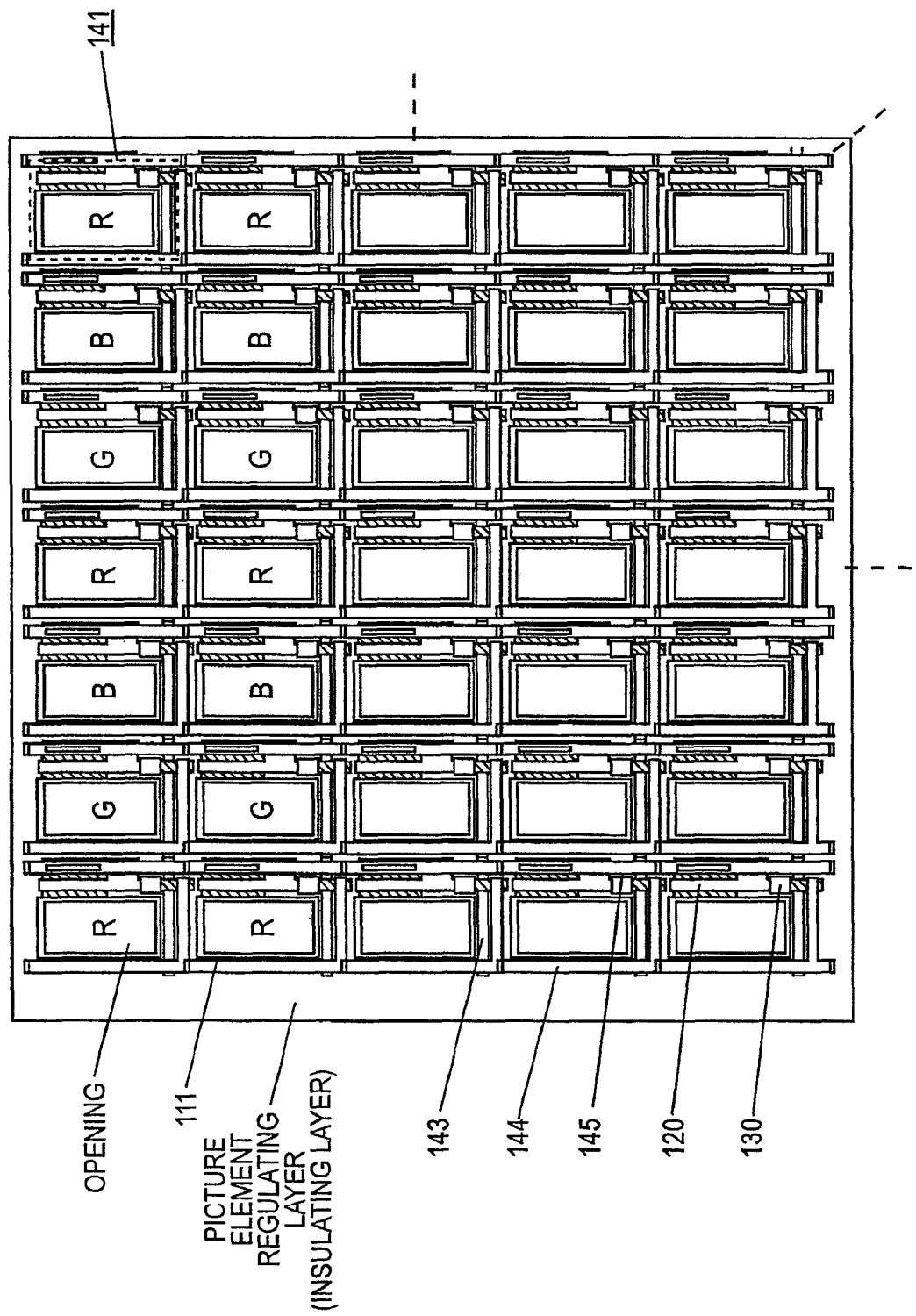
FIG. 5 A layout explanatory diagram of the display device according to embodiment 3 of the present invention.
Figure 6:
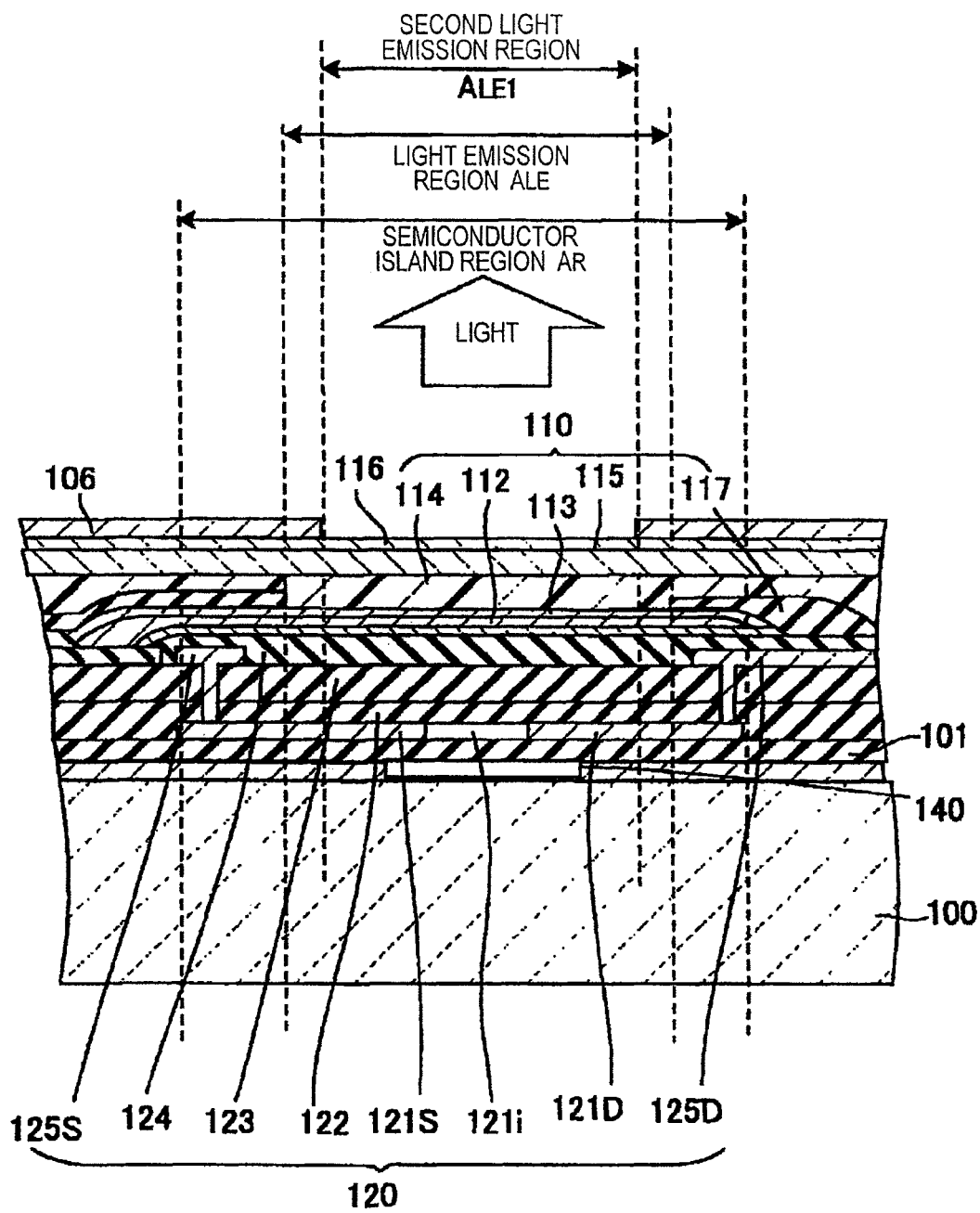
FIG. 6 A cross-sectional view of the display device according to embodiment 3 of the present invention.
Figure 7:
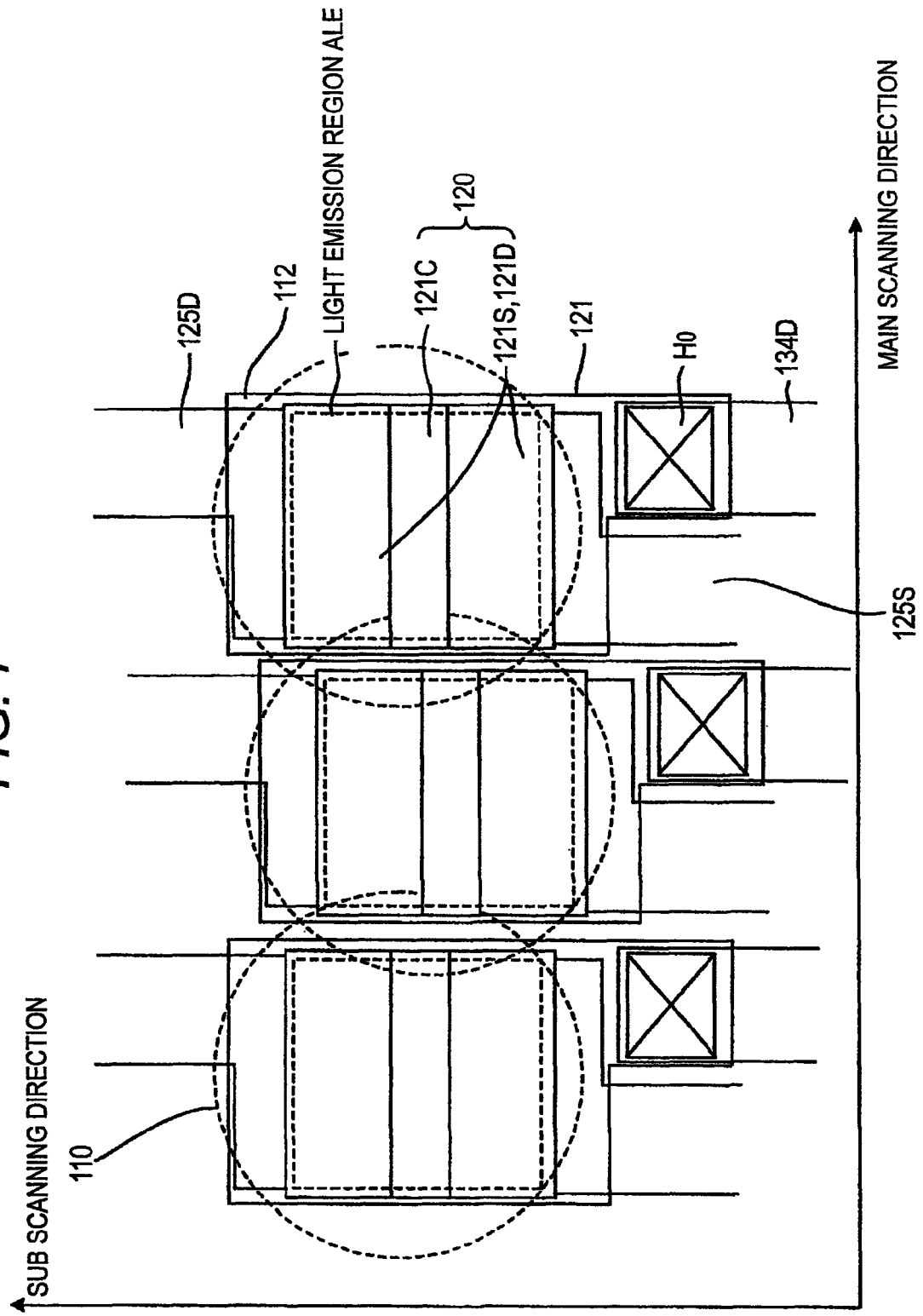
FIG. 7 A top surface explanatory diagram of the display device according to embodiment 3 of the present invention.
Figure 8:
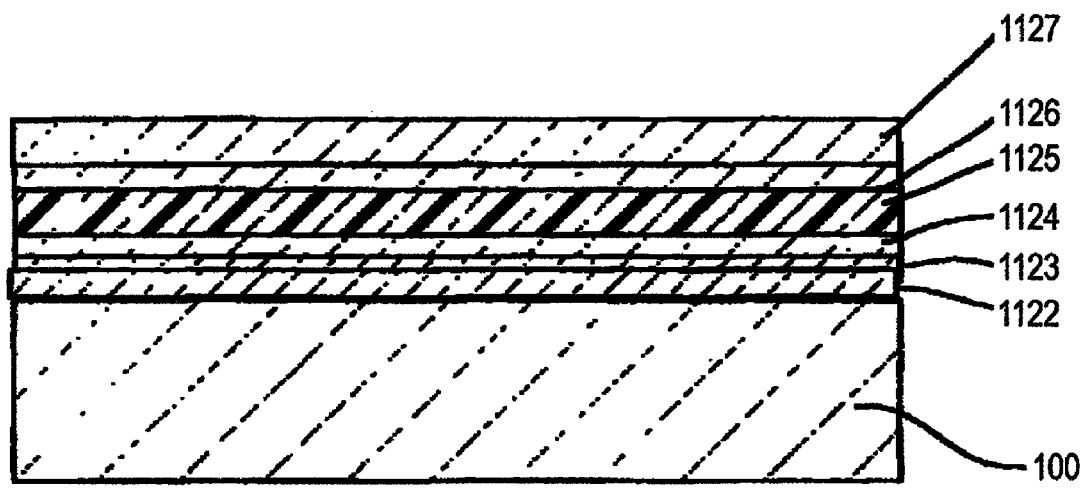
FIG. 8 An explanatory view showing the organic electroluminescence element of a conventional example.

As shown in FIG. 4 illustrating an equivalent circuit diagram of this matrix-type display device, in FIG. 5 illustrating an layout explanatory diagram, in FIG. 6 illustrating a cross-sectional view and in FIG. 7 illustrating a top surface explanatory diagram, the display device above constitutes an active matrix-type display device where a driving circuit is formed for each picture element.

This display device 140 is fabricated, as shown in FIG. 4 illustrating an equivalent circuit diagram and in FIG. 5 illustrating an layout explanatory diagram, such that a plurality of driving circuits each consisting of an organic electroluminescence element (electroluminescence) 110 forming a picture element, two thin-film transistors (TFT: T1, T2) composed of a switching transistor 130 and a current transistor 120 as the photodetection element, and a capacitor C are arrayed vertically and horizontally, a gate electrode of a first TFT (T1) in each of the driving circuits arranged in a horizontal row is connected to a scanning line 143 to give a scanning signal, and a drain electrode of a first TFT in each of the driving circuits arranged in a vertical row is connected to a data line to supply a light emission signal. To one end of the electroluminescence element (electroluminescence), a driving power source (not shown) is connected, and one end of the capacitor C is grounded. Reference numeral 143 denotes a scanning line, 144 denotes a signal line, 145 denotes a common power feeder cable, 147 denotes a scanning line driver, 148 denotes a signal line driver and 149 denotes a common power feeder driver.

FIG. 6 is a cross-sectional explanatory view of the organic electroluminescence element (FIG. 6 is an A-A cross-sectional view of FIG. 5), and FIG. 7 is a top surface explanatory diagram of the display device, where on a glass substrate 100 having formed thereon driving TFTs (not shown), an anode (Al) 112, a surface-oxidized molybdenum oxide layer (transition metal oxide layer) 113, an organic interlayer (charge blocking layer) (not shown), a light-emitting layer 114 (a red light-emitting layer R, a green light-emitting layer G and a blue light-emitting layer B), a barium oxide-containing molybdenum oxide layer 115 and a cathode 116 are formed to fabricate a top emission-type organic electroluminescence element. As for the structure, the anode and the charge injection layer are individually formed, the light-emitting layer has an opening area defined by a protrusion composed of a silicon oxide layer as the picture element regulating layer 117, and the cathode 116 is formed like a stripe running in a direction orthogonal to the anode.

The driving TFT is formed such that, for example, after an organic semiconductor layer (polymer layer) is formed on a glass substrate 100 and covered with a gate insulating film, a gate electrode is formed thereon and at the same time, a source/drain electrode is formed through a through-hole formed in the gate insulating film. On this transistor, a polyimide film or the like is coated to form an insulating layer (flat layer) and furthermore, an anode (ITO) 112, a surface-oxidized molybdenum oxide layer 113, an electron blocking layer, an organic semiconductor layer 114 such as light-emitting layer, a barium oxide-containing molybdenum oxide layer 115 and a cathode 116 (Al ultra-thin film and ITO) are formed to manufacture an organic electroluminescence element. In FIG. 7, the capacitor and wiring are omitted, but these are formed on the same glass substrate. A plurality of picture elements each composed of such TFT and organic electroluminescence element are formed in a matrix manner on the same substrate to constitute an active matrix-type display device.

At the manufacturing, as shown in FIG. 5, a picture element regulating layer 117 is formed, for example, on a scanning line 143, a signal line 144, a switching TFT 130 and an electrode 112 composed of a pattern of aluminum constituting a picture element electrode, which are formed on a glass substrate 100, and an opening is then provided.

As an upper layer thereof, a transition metal oxide layer 113 is formed over the entire surface by a sputtering method, and the surface is oxidized with an ultraviolet ray.

Thereafter, if desired, TFB as an interlayer is coated by an inkjet method. This TFB layer may be coated over the entire surface similarly to the transition metal oxide layer or may be coated only on a portion corresponding to the opening.

After passing through a drying step, a polymer organic electroluminescence material for a desired color (any one of RGB) is coated by an inkjet method on a position corresponding to the opening to form a light-emitting layer 114.

Furthermore, a barium oxide-containing molybdenum layer 115 is film-formed by vapor co-deposition or the like, and finally, a cathode 116 is formed in a region where a display picture element 141 is disposed.

According to this construction, a display device capable of high-speed driving and assured of high reliability can be provided. Since a molybdenum oxide layer that is integrally formed and is an oxide of a transition metal intervenes between the light-emitting layer and the anode in the form of being surface-oxidized, no cross-talk occurs and the light-emitting layer is filled in a recess part smoothed by the molybdenum oxide layer and controlled in size with high precision. Therefore, the light-emitting layer can be unfailingly formed by an inkjet method without causing position slippage, and a light-emitting layer controlled in the film thickness and size with high precision can be obtained. Also on the light-emitting layer, an integrally-formed molybdenum oxide layer is formed and therefore, the light-emitting layer is free from a sputtering damage when forming the cathode or a plasma damage in the patterning step.

In this way, the light-emitting layer can be formed on a uniformly-formed surface and the surface can be kept in a smooth state, so that the light-emitting layer can be uniformly formed and an electric field applied by the anode and cathode can be uniformly imparted to the light-emitting layer without occurrence of electric field concentration, succeeding in obtaining good light emission characteristics. Also, each light-emitting layer is uniformly formed, so that good light emission characteristics can be obtained without variation in the light emission characteristics.

An example of the lighting device using a light-emitting device having two-dimensionally disposed therein a plurality of electroluminescence elements is described below by referring to FIG. 5. As regards the two-dimensionally disposed electroluminescence elements 110, for example, such a construction as concurrently lighting on/off all electroluminescence elements can be quite easily realized. However, even in the case of such a construction as concurrently lighting on/off the electroluminescence elements, it is preferred to take a construction where at least one electrode (for example, a picture element electrode composed of Al (see, the anode 112 in FIG. 6)) is separated for individual electroluminescence elements. This is because even when a display picture element 141 is found to have a defect by some factors, the defect remains in the display picture element 141 and therefore, the production yield of the lighting device as a whole can be enhanced. The lighting device having the above-described construction is applicable, for example, to domestic lighting equipment in general. In this application, since the lighting device can be constructed extremely thin, the lighting device can be easily installed not only on a ceiling but also on a wall.

Furthermore, the light emission pattern of the two-dimensionally disposed electroluminescence elements can be easily controlled by supplying arbitrary data, and the electroluminescence element of the present invention can be constructed to give a light emitting region in a size of for example, 40 μm-square, so that an application allowing the lighting device to serve also as a panel-type display device by supplying data can be constructed. Of course, in this case, the display picture elements 141 need to be color-coded red, green or blue depending on the position, but multiple coloration can be very easily realized by using an inkjet method.

Conventionally, when a lighting device is compared with a display device, the light emission brightness is higher in the lighting device. However, the electro-luminescence element 110 of the present invention can take a sufficiently large area and has very high light emission brightness and therefore, this element can be used as both a lighting device and a display device. In this case, a mechanism for adjusting the light emission brightness is needed due to difference in the function (that is, the use mode) between the lighting device and the display device, and the mechanism therefor can be realized, for example, by employing the construction of embodiment 2 above and controlling the drive current, thereby adjusting the light emission brightness of each electroluminescence element. More specifically, the light emission brightness can be adjusted by, in use as a lighting device, driving all electroluminescence elements with a larger current, and in use as a display device, driving each electroluminescence element with a small current at a current value controlled according to the gradation (that is, according to the image data). In such an application, a single power source may be used for the power source when functioning as a lighting device and when functioning as a display device, but in the case where a drive current is controlled, for example, where the dynamic range of a digital-to-analog converter is large and the number of gradations becomes insufficient in use as a display device, it is preferred to take a construction of switching the power source between those (not illustrated) connected to a common power feeder cable 145 shown in FIGS. 4 and 5 according to the use mode. Of course, even in the use mode as a lighting device, in the case of an embodiment where brightness needs to be controlled (that is, a lighting device having a light control function), this can be easily coped with by the above-described control of a current value according to the gradation. Furthermore, the electroluminescence element of the present invention can be formed not only on a glass substrate 100 but also on a resin substrate such as PET and therefore, can be applied as a lighting device for various illuminations.

Incidentally, the thin film transistor may be composed of an organic transistor. Also, a structure where an organic electroluminescence element is stacked on a thin film transistor, or a structure where a thin film transistor is stacked on an organic electroluminescence element, is also effective.

In addition, in order to obtain a high-image quality electroluminescence display device, an electroluminescence substrate having formed thereon an organic electro-luminescence element may be laminated together with a TFT substrate having formed thereon TFT, a capacitor, a wiring and the like, such that an electrode of the electro-luminescence substrate and an electrode of the TFT substrate are connected using a connection bank.

As a modified example of embodiment 3, the method for color coding in a color display device is described below.

In this example, RGB coding is performed using a substrate having formed thereon a thin film transistor. A flattening film is formed of an insulating organic material on a TFT substrate, a transparent electrode is formed on the substrate by sputtering ITO, image regulating layers in respective thicknesses are formed of SiN similarly to embodiment 4, and dry etching is applied to give a desired light emission region.

Using this TFT substrate, RGB coating is performed. A flattening film is formed of an insulating organic material on a TFT substrate, a transparent electrode is formed on the substrate by sputtering ITO, image regulating layers in respective thicknesses are formed of SiON similarly to embodiment 1, and dry etching is applied to give a desired light emission region. Thereafter, as the hole injection layer of the present invention, sputtering is performed while flowing oxygen and argon by using an alloy of tungsten and molybdenum as the target to form a hole injection layer composed of an oxide. Subsequently, the substrate is introduced into an oxygen plasma apparatus and irradiated at 200 W for 30 seconds to oxidize the outermost surface.

Furthermore, a bank composed of polyimide is formed for each row of RGB picture elements, whereby a substrate divided in a stripe manner into respective rows of elements by a bank is obtained. An electroluminescence element is formed using the resulting substrate. This substrate is characterized by high resistance compared with PEDT and no occurrence of cross-talk and therefore can be used in such a way. Thereafter, TFB as an interlayer is coated to a thickness of 20 nm by an inkjet method for each of rows divided by a bank. After drying and baking, an ink prepared from a red light-emitting material, a green light-emitting material or a blue light-emitting material is coated as the light-emitting layer by using a dispenser to an average thickness of 80 nm on each of rows divided by a bank. Furthermore, a layer composed of a Ba-doped low-molecular electron transport material is formed as the electron injection layer by a resistance heating vapor deposition method, and aluminum is then vacuum vapor-deposited to a thickness of 100 nm as the cathode. The electron injection layer and cathode are formed to cover all picture elements.

TFT in a part of the obtained sample is operated by an external circuit and evaluated for the light emission state and lifetime. As a result, sufficient light emission state and lifetime are obtained.

Embodiment 5

(Lighting Device)

As an example of the lighting device, molybdenum oxide is sputtered to a thickness of 100 nm on a 30 cm-square glass substrate having provided thereon ITO, and a polymer-type white light-emitting material is then spin-coated to a thickness of 100 nm. Subsequently, sodium fluoride is 10% vapor co-deposited with zinc oxide of the present invention as the electron injection layer, and Ag is further formed to a thickness of 100 nm as the cathode.

DC of 10 V is applied to the thus-obtained sample, as a result, uniform light emission is obtained and even in an unencapsulated state, the device is stably driven for 1 hour without causing a short circuit or producing a dark spot.

Example 1

The present invention is described below by referring to Examples. The organic electroluminescence light-emitting device of the present invention is an example corresponding to embodiment 1 and is described by referring to FIG. 1.

On a glass substrate 1 with a 0.7 mm-thick patterned ITO (2), a molybdenum oxide layer was film-formed as the hole injection layer to a thickness of 10 nm by a sputtering method and irradiated for 3 minutes at an oscillation wavelength of 172 nm by using an excimer UV exposure apparatus, SNA/14, manufactured by Ushio Inc. to oxidize the surface. The sample was then placed in a glove box filled with nitrogen, and TFB (poly-2,7-9,9-di-n-octylfluorene-alt-1,4-phenylene-4-sec-butylphenylimino-1,4-phenylene), which is a copolymerization polymer of fluorene and triphenylamine, was spin-coated as the interlayer to a thickness of 20 nm and baked at 180° C. in nitrogen. Subsequently, a green light-emitting material (produced by Sumation Co., Ltd.) was spin-coated to 80 nm and similarly baked in nitrogen to form a light-emitting layer. The element was then transferred to a vacuum vapor deposition apparatus, and Ba of 5 nm in thickness as the electron injection layer and Al of 100 nm in thickness as the cathode were vapor-deposited. After sealing a getter agent for an organic EL in a nitrogen atmosphere, the periphery of the obtained element was sealed with a UV-sensitive encapsulating resin. This was designated as Sample 103. Sample 104 was manufactured in the same manner as Sample 102 except that in Sample 102, after forming the molybdenum oxide film, the substrate was introduced into an oxygen plasma apparatus and irradiated with a plasma of 200 W for 1 minute.

Here, at the surface oxidation, even when the treatment is performed at 250° C. for 45 minutes in the atmosphere, the same results were obtained.

As regards Comparative Sample 102 for comparison, the sample obtained by not performing UV irradiation or oxygen plasma irradiation in Sample 103 or 104 was used directly. Also, Sample 101 was manufactured in the same manner as Samples 102 to 104 except that in the manufacture of Comparative Sample 102, instead of vacuum vapor-depositing molybdenum oxide to a thickness of 10 nm, PEDT produced by H. C. Starck was spin-coated as the hole injection layer on a glass substrate 1 with a 0.7 mm-thick patterned ITO(2) in the atmosphere to a thickness of 60 nm and dried by baking at 200° C. for 10 minutes and after transferring the element into a glove box, an interlayer and layers therebelow were coated.

As described above, Sample 103 was manufactured in the same manner as Sample 102 except that in Sample 102, UV irradiation was performed after forming the molybdenum oxide layer.

Sample 104 was manufactured in the same manner as Sample 102 except that in Sample 102, after forming the molybdenum oxide film, the substrate was introduced into an oxygen plasma apparatus and irradiated with a plasma of 200 W for 1 minute. Samples 101 to 104 obtained were evaluated for IV characteristics and light emission brightness characteristics by using ITO and Al as the anode and the cathode, respectively.

As a result, the voltage for driving Samples 102 to 104 was decreased by about 0.5 V as compared with Sample 101. The light emission characteristics are shown in the Table below.

TABLE 1

| Sample | Hole Injection Layer | Light Emission Efficiency (Cd/A) at 20 mA/cm$^2$ | Driving Lifetime at 12,000 cd/m$^2$ |
|---|---|---|---|
| 101 (Comparative Example) | PEDT | 10.2 | 120 hr |
| 102 (Comparative Example) | MoO$_x$ (untreated) | 8.4 | 230 hr |
| 103 (Iinvention) | MoO$_x$ (UV treated) | 10.5 | 310 hr |
| 104 (Invention) | MoO$_x$ (O$_2$ plasma treated) | 11.1 | 320 hr |

As apparent from Table 1, in the case of using untreated MoO$_x$, the driving lifetime is improved but the light emission efficiency is worse than in Comparative Example using PEDT, whereas in the sample of the present invention subjected to an oxidation treatment, the light emission efficiency is equal to or higher than that when using PEDT and the driving lifetime is also enhanced.

Next, a pattern having a plurality of picture elements as shown FIG. 5 was produced. ITO as the anode was divided for individual picture elements, and the pattern was produced to make it possible to externally drive individual elements. On this substrate, a photosensitive resist was coated as an insulating film, exposed and developed to form a picture element with a desired size. Furthermore, a material used in Samples 101 to 104 was coated or vapor-deposited on the entire surface thereof. In the samples obtained, the hole injection layer, interlayer, light-emitting layer and anode each was formed across a plurality of picture elements. In these samples, a voltage was applied to only one picture element to emit light at about 1,000 cd/m$^2$, as a result, in Sample 101, light emission at a level enabling an adjacent picture element to be viewed with an eye was observed. In Samples 102 to 104, light emission was not confirmed.

In general, an interlayer and a light-emitting layer are formed of an organic material and therefore, have a high resistance and even when such a layer is integrally formed across picture elements, cross-talk does not occur. On the other hand, PEDT is originally a solution obtained by dispersing the mixture in water and even when dried, is small in the specific resistance. Accordingly, in the case of forming a film thereof across a plurality of picture elements, there raises a serious problem that when a common cathode is used, an adjacent picture element not applied with a voltage also emits light. Molybdenum oxide for use in the present invention has a high specific resistance in the transverse direction and advantageously causes no cross-talk but is deficient in that when molybdenum oxide as-deposited is used, light emission efficiency equal to or greater than that in using PEDT is not obtained depending on the light-emitting material. However, when the oxidation treatment of the present invention is performed, the light emission efficiency becomes equal to or greater than that in using PEDT, and IV characteristics at an equal level are obtained. At the same time, a merit can be found in that thanks to enhancement of the light emission efficiency, the drive current value is decreased and the lifetime is also improved.

In Example 1, the ratio of molybdenum to oxygen was examined by analyzing the surface composition of the molybdenum oxide thin film used in Samples 102 to 104 by the use of an X-ray photoelectron spectroscopy. As a result, in Sample 102, the ratio of Mo to oxygen was determined as 2.7. This is a value for a ratio between 3p orbital signal of Mo and 2p orbital signal of oxygen. The ratio was determined as 2.9 and 3.0 in Sample 103 and Sample 104, respectively. This apparently reveals that molybdenum oxide is oxidized by the surface oxidation treatment indicated in Example 1 and the proportion of oxygen is relatively increased in comparison with molybdenum. That is, by virtue of the oxidation treatment of the present invention, the oxygen-deficient portion is oxidized by the oxidation treatment, as a result, the surface of oxygen-deficient molybdenum oxide comes close to the theoretical ratio of the compound. In such an oxidation treatment, oxidation is considered to proceed in the thickness direction of a thin film according to the time, power, temperature or the like of the oxidation treatment, but if oxidation proceeds and the stoichiometric ratio is established in the entire layer, conversely, the injection efficiency is greatly impaired. Accordingly, in order to maximally bring out the effect of enhancing the light emission efficiency of the present invention, it is considered to be necessary that on the side in contact with the anode, oxygen deficiency is present to form a defect level on HOMO and on the side in contact with a material having a light-emitting function, only the extreme surface is subjected to an oxidation treatment.

Here, it is more effective that not only the ratio of molybdenum to oxygen at the layer with a light-emitting function side is greater than that at the anode side but also the proportion of oxygen is greater than the stoichiometric ratio (X>3).

Example 2

Samples 202 to 204 were manufactured in the same manner by forming a tungsten oxide-sputtered film to a thickness of 20 nm in place of molybdenum oxide of Samples 102 to 104 of Example 1. As for the tungsten oxide, a tungsten oxide film was formed by so-called reactive sputtering of introducing oxygen by using a metal target. Other steps are the same as in Example 1. When the same evaluations as in Example 1 were performed, almost the same results were obtained.

Example 3

Samples 302 to 304 were manufactured and evaluated in the same manner by preparing an alloy target of molybdenum and tungsten in an element ratio of 30:70 and using the target in the samples of Example 2. The results are shown in Table 2.

TABLE 2

| Sample | Hole Injection Layer | Light Emission Efficiency (Cd/A) at 20 mA/cm$^2$ | Driving Lifetime at 12,000 cd/m$^2$ |
|---|---|---|---|
| 101 (Comparative Example) | PEDT | 10.2 | 120 hr |
| 302 (Comparative Example) | MoWO$_x$ (untreated) | 8.2 | 190 hr |
| 303 (Invention) | MoWO$_x$ (UV treated) | 11.5 | 350 hr |
| 304 (Invention) | MoWO$_x$ (O$_2$ plasma treated) | 12.6 | 380 hr |

As apparent from these results, in the samples using an alloy target of tungsten and molybdenum and being, subjected to the surface treatment of the present invention, the increase of light emission efficiency is larger than in the results when manufacturing the sample by using molybdenum alone or tungsten alone and performing the surface treatment. Detailed reasons therefor are not clearly known but are considered that the defect level formed in the extreme surface becomes a level suitable for an electron blocking layer.

Also, in the case where a large number of organic electroluminescence element cells are arrayed and formed and where a resinous partition wall is provided and a layer with a light-emitting function is formed in the region surrounded by the partition wall, a resin film needs to be patterned on the electron injection layer and in this patterning step, molybdenum oxide may dissolve out. However, by virtue of containing tungsten, molybdenum oxide can be prevented from dissolving out and also in this case, not only a smooth surface can be maintained without losing surface smoothness but also characteristic deterioration can be prevented.

Example 4

Using the hole injection layer used in Samples 302 to 304 of Example 3, samples were manufactured without use of an interlayer by coating a green light-emitting material and forming a cathode in the same manner, and designated as Samples 402 to 404. These samples were evaluated for the characteristics, as a result, the drive voltage was further decreased by about 0.5 V. This is considered to occur because the entire film thickness of the organic semiconductor layer is decreased due to removal of an interlayer. The light emission efficiency was greatly reduced in the case of untreated molybdenum oxide, whereas in samples of the present invention subjected to an oxidation treatment, reduction of the light emission efficiency does not occur even when an interlayer is removed. This is considered to be ascribable to the fact that by applying an oxidation treatment, only the surface layer in which the surface of molybdenum oxide is oxidized comes to exhibit the property as an insulator and an effective depletion layer is not allowed to be present at the energy level of an electron transported by hopping conduction on LUMO of the light-emitting layer. As for the hole injection, it can be understood that tunnel injection is possible with a thickness of several nm and the hole injection efficiency is not decreased.

TABLE 3

| Sample | Hole Injection Layer | Light Emission Efficiency (Cd/A) at 20 mA/cm$^2$ | Driving Lifetime at 12,000 cd/m$^2$ |
|---|---|---|---|
| 101 (Comparative Example) | PEDT | 10.2 | 120 hr |
| 402 (Comparative Example) | MoO$_x$ (untreated) | 6.1 | 240 hr |
| 403 (Invention) | MoO$_x$ (UV treated) | 10.5 | 420 hr |

TABLE 3-continued

| Sample | Hole Injection Layer | Light Emission Efficiency (Cd/A) at 20 mA/cm$^2$ | Driving Lifetime at 12,000 cd/m$^2$ |
|---|---|---|---|
| 404 (Invention) | MoO$_x$ (O$_2$ plasma treated) | 10.1 | 440 hr |

It is clearly seen from these Examples that the oxidation treatment of the present invention can enhance the light emission efficiency without adversely affecting the IV characteristics and at the same time, the items required in terms of cross-talk are satisfied.

According to the organic electroluminescence element of the present invention, an organic electroluminescence element ensuring particularly enhanced electron blocking characteristics as well as long lifetime can be provided, and this organic electroluminescence element can be applied not only to an application requiring multicolor emission, such as television and display, but also to a device utilizing monochromatic emission, such as exposure device, printer and facsimile.

What is claimed is:

1. A method for manufacturing an electroluminescence element which comprises an anode; a cathode; a plurality of functional layers formed between the anode and the cathode, the functional layer including a layer with a light-emitting function formed of at least one kind of an organic semiconductor; and a charge injection layer formed between the anode and the layer with a light-emitting function and formed from at least one kind of a transition metal oxide layer, the method comprising:

the step of forming the transition metal oxide layer is a step of forming the transition metal oxide layer such that the ratio of the metal to oxygen at the anode side in the transition metal oxide layer is smaller than the stoichiometric ratio and the ratio of the metal to oxygen at the layer with a light-emitting function side is greater than that at the anode side.

2. The method for manufacturing an organic electroluminescence element according to claim 1, wherein the step of forming said transition metal oxide layer contains a step of film-forming a transition metal oxide layer and a surface oxidation treatment step of oxidizing the surface of said transition metal oxide layer.

3. The method for manufacturing an organic electroluminescence element according to claim 2, wherein the surface oxidation treatment step contains a step of oxidatively treating the surface by a heat treatment.

4. The method for manufacturing an organic electroluminescence element according to claim 2, wherein the surface oxidation treatment step contains a step of oxidatively treating the surface by an ultraviolet treatment.

5. The method for manufacturing an organic electroluminescence element according to claim 2, wherein the surface oxidation treatment step contains a step of oxidatively treating the surface with an oxygen-containing plasma.

6. The method for manufacturing an organic electroluminescence element according to claim 1, wherein the step of forming said transition metal oxide layer is a dry process.

7. The method for manufacturing an organic electroluminescence element according to claim 2, wherein the step of forming said transition metal oxide layer is a dry process.

8. The method for manufacturing an organic electroluminescence element according to claim 3, wherein the step of forming said transition metal oxide layer is a dry process.

9. The method for manufacturing an organic electroluminescence element according to claim 4, wherein the step of forming said transition metal oxide layer is a dry process.

10. The method for manufacturing an organic electroluminescence element according to claim 5, wherein the step of forming said transition metal oxide layer is a dry process.

* * * * *